United States Patent
Uemoto et al.

(10) Patent No.: US 9,218,937 B2
(45) Date of Patent: Dec. 22, 2015

(54) CHARGED PARTICLE BEAM APPARATUS HAVING IMPROVED NEEDLE MOVEMENT CONTROL

(71) Applicant: HITACHI HIGH-TECH SCIENCE CORPORATION, Minato-ku, Tokyo (JP)

(72) Inventors: Atsushi Uemoto, Tokyo (JP); Tatsuya Asahata, Tokyo (JP); Hidekazu Suzuki, Tokyo (JP); Yo Yamamoto, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 14/617,273

(22) Filed: Feb. 9, 2015

(65) Prior Publication Data

US 2015/0228451 A1 Aug. 13, 2015

(30) Foreign Application Priority Data

Feb. 12, 2014 (JP) .................. 2014-024422

(51) Int. Cl.
*H01J 37/20* (2006.01)
*H01J 37/28* (2006.01)
*H01J 37/26* (2006.01)

(52) U.S. Cl.
CPC .............. *H01J 37/20* (2013.01); *H01J 37/261* (2013.01); *H01J 2237/063* (2013.01); *H01J 2237/08* (2013.01); *H01J 2237/202* (2013.01); *H01J 2237/2007* (2013.01); *H01J 2237/2448* (2013.01); *H01J 2237/2602* (2013.01)

(58) Field of Classification Search
CPC ..... H01J 37/20; H01J 37/3056; H01J 37/261; H01J 37/3045; H01J 37/185; H01J 37/28; G01R 31/307; G01R 31/2887; G01R 31/2891
USPC ............ 250/492.21, 311, 442.11, 492.3, 306, 250/307, 310, 492.2, 492.1, 440.11; 324/750.01, 750.19, 754.03, 754.21; 850/5

See application file for complete search history.

(56) References Cited

U.S. PATENT DOCUMENTS

| | | | | |
|---|---|---|---|---|
| 6,538,254 | B1 * | 3/2003 | Tomimatsu et al. | 250/442.11 |
| 6,828,566 | B2 * | 12/2004 | Tomimatsu et al. | 250/442.11 |
| 7,071,475 | B2 * | 7/2006 | Tomimatsu et al. | 250/442.11 |
| 7,071,713 | B2 * | 7/2006 | Furukawa et al. | 324/750.19 |
| 7,372,283 | B2 * | 5/2008 | Furukawa et al. | 324/754.22 |
| 7,397,050 | B2 * | 7/2008 | Tomimatsu et al. | 250/492.21 |
| 7,397,052 | B2 * | 7/2008 | Tomimatsu et al. | 250/492.21 |
| 7,414,252 | B2 * | 8/2008 | Moore et al. | 250/492.21 |
| 7,700,931 | B2 * | 4/2010 | Shichi et al. | 250/492.21 |

(Continued)

FOREIGN PATENT DOCUMENTS

JP 2000 147070 5/2000

*Primary Examiner* — David A Vanore
(74) *Attorney, Agent, or Firm* — Adams & Wilks (57) ABSTRACT

A charged particle beam apparatus includes: a charged particle beam column configured to irradiate an irradiation target with a charged particle beam; a detector configured to detect secondary charged particles emitted from the irradiation target by the irradiation of the charged particle beam; a needle arranged in an irradiation area of the charged particle beam; a needle actuator configured to actuate the needle; and a controller configured to control the needle actuator to actuate the needle along a movement route that is configured by a preset target position and preset way points. The controller controls the needle actuator to set an actuating direction of the needle for each of the way points.

4 Claims, 7 Drawing Sheets

(56) References Cited

U.S. PATENT DOCUMENTS

| | | |
|---|---|---|
| 7,791,050 B2 * | 9/2010 | Tomimatsu et al. ..... 250/492.21 |
| 7,932,733 B2 * | 4/2011 | Sasajima et al. ......... 324/750.01 |
| 7,999,240 B2 * | 8/2011 | Tomimatsu et al. ..... 250/492.21 |
| 8,405,053 B2 * | 3/2013 | Tomimatsu et al. ..... 250/492.21 |
| 8,431,891 B2 * | 4/2013 | Shichi et al. .................. 250/306 |
| 2002/0017619 A1 * | 2/2002 | Hirose et al. ................ 250/492.3 |
| 2005/0178980 A1 * | 8/2005 | Skidmore et al. ........ 250/492.21 |
| 2006/0091325 A1 * | 5/2006 | Moore et al. ............. 250/492.21 |
| 2008/0073582 A1 * | 3/2008 | Shichi et al. ............. 250/492.21 |
| 2013/0320209 A1 * | 12/2013 | Shichi et al. .................. 250/307 |

* cited by examiner

CHARGED PARTICLE BEAM APPARATUS HAVING IMPROVED NEEDLE MOVEMENT CONTROL

CROSS-REFERENCE TO RELATED APPLICATION

This application claims priority from Japanese Patent Application No. 2014-024422, filed on Feb. 12, 2014, the entire subject matter of which is incorporated herein by reference.

BACKGROUND

1. Technical Field

The present invention relates to a charged particle beam apparatus.

2. Description of the Related Art

Conventionally, a charged particle beam apparatus has been known in which a needle that is movable by an actuator is disposed in the apparatus, an observation image obtained by a charged particle beam is displayed on a display device, and the needle is moved to a position that is indicated in the observation image by a user interface operated by the operator. An example of such apparatus is disclosed in JPA-2000-147070.

In the apparatus of the background art, there is the case where the needle is automatically moved to a predetermined position, such as the case where, when the needle is not used, the needle is automatically retracted to the outside of the observation area. When, in such a case, the needle is linearly moved from the current position to a preset position or a predetermined position which is instructed through the user interface, there is a possibility that the needle makes contact with another component of the apparatus that exists on the movement route.

SUMMARY

The present invention has been made in view of the above-described circumstances, and one of objects of the present invention is to provide a charged particle beam apparatus, in which a safety is improved for a case where a needle is automatically moved in the apparatus.

According to an exemplary embodiment of the present invention, there is provided a charged particle beam apparatus including: a charged particle beam column configured to irradiate an irradiation target with a charged particle beam; a detector configured to detect secondary charged particles emitted from the irradiation target by the irradiation of the charged particle beam; a needle arranged in an irradiation area of the charged particle beam; a needle actuator configured to actuate the needle; and a controller configured to control the needle actuator to actuate the needle along a movement route that is configured by a preset target position and preset way points. The controller controls the needle actuator to set an actuating direction of the needle for each of the way points.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

Hereinafter, a charged particle beam apparatus according to an embodiment of the invention will be described with reference to the accompanying drawings.

Figure 1:
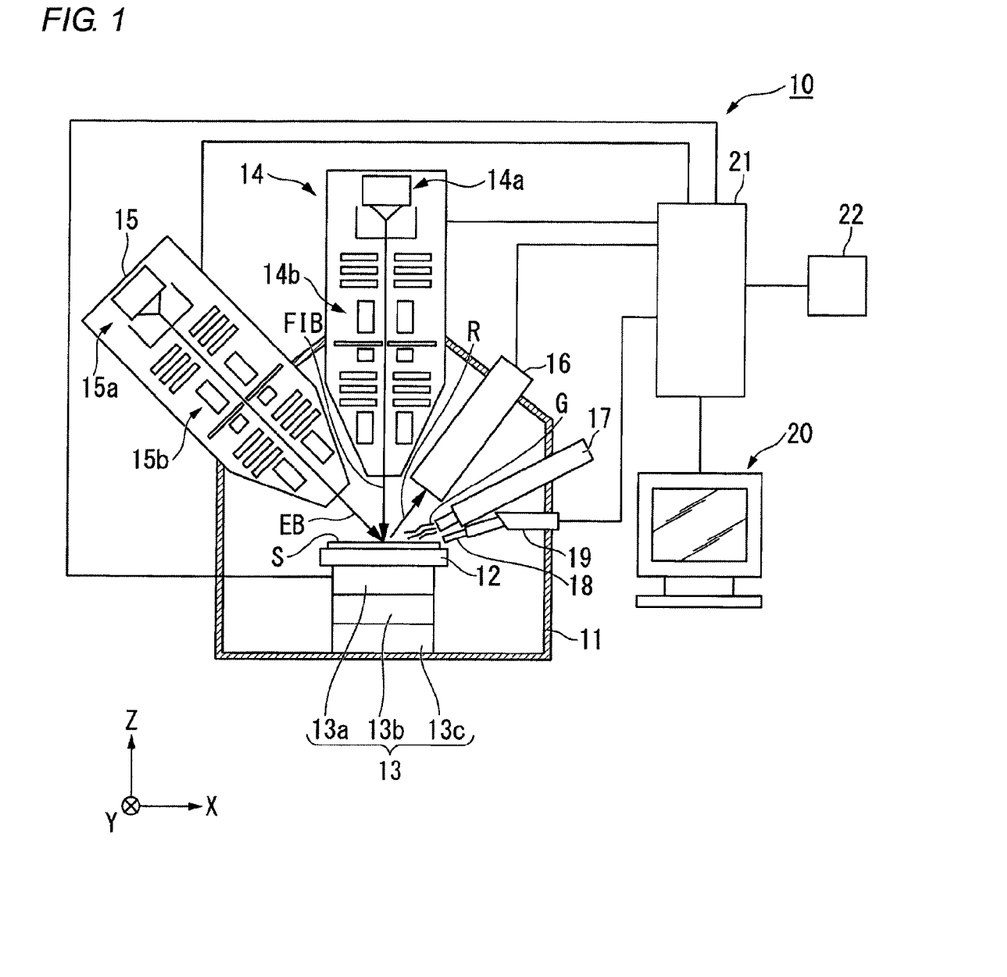
FIG. 1 is a view showing a configuration of a charged particle beam apparatus of an embodiment of the invention.

As shown in FIG. 1, the charged particle beam apparatus 10 according to the embodiment is provided with: a sample chamber 11, the interior of which can be maintained in a vacuum condition; a stage 12 which can fix a sample S inside the sample chamber 11; and a stage actuator 13 which moves the stage 12. The charged particle beam apparatus 10 further has a focused ion beam column 14 which irradiates an irradiation target in a predetermined irradiation area (i.e., a scan area) in the sample chamber 11 with a focused ion beam (FIB). The charged particle beam apparatus 10 further has an electron beam column 15 which irradiates the irradiation target in the predetermined irradiation area in the sample chamber 11 with an electron beam (EB). The charged particle beam apparatus 10 further has a detector 16 which detects secondary charged particles (secondary electrons and secondary ions, or the like) R generated from the irradiation target by the irradiation with the focused ion beam or the electron beam. The charged particle beam apparatus 10 further has a gas supplying unit 17 which supplies a gas G to the surface of the irradiation target. The charged particle beam apparatus 10 further has a needle 18 which is to be in contact with the sample S fixed to the stage 12, and a needle actuator 19 which actuates the needle 18. The charged particle beam apparatus 10 is further provided with: a display device 20 which displays image data due to the secondary charged particles R detected by the detector 16 and other data; a controller 21; and a user interface 22.

The irradiation target of the focused ion beam column 14 and the electron beam column 15 is configured by the sample S fixed to the stage 12, the needle 18 existing in the irradiation area, and the like.

The charged particle beam apparatus 10 according to the embodiment irradiates the surface of the sample S configured by a semiconductor wafer, a semiconductor chip, or the like with the focused ion beam while scanning, whereby various processes (etching and the like) of the sample S by sputtering, and formation of a deposition film can be performed. For example, the charged particle beam apparatus 10 can perform processes of: forming a cross section for cross-section observation by a scanning electron microscope, in the sample S; or forming a sample (for example, a thin sample, or an acicular sample) for transmission observation by a transmission electron microscope, from the sample S. The charged particle beam apparatus 10 according to the embodiment is able to irradiate the surface of the irradiation target configured by the sample S, the needle 18, and the like with the focused ion beam or the electron beam while scanning, whereby the surface of the irradiation target can be observed.

The sample chamber 11 is configured so that the interior can be evacuated by an evacuating device (not shown) until a desired vacuum condition is attained, and the desired vacuum condition can be maintained.

The stage actuator 13 is housed in the sample chamber 11 in a state where the mechanism is connected to the stage 12, and moves the stage 12 with respect to predetermined axes in accordance with a control signal supplied from the controller 21. The stage actuator 13 is provided with a movement mechanism 13a which moves the stage 12 in parallel along the X- and Y-axes which are parallel to the horizontal plane and perpendicular to each other, and the Z-axis which is perpendicular to the X- and Y-axes. The stage actuator 13 is provided with a tilt mechanism 13b which rotates the stage 12 about the X-axis or the Y-axis, and a rotation mechanism 13c which rotates the stage 12 about the Z-axis.

The focused ion beam column 14 is fixed to the sample chamber 11 in such a manner that, in the sample chamber 11, a beam emitting portion (not shown) faces the stage 12 at a position which is vertically above the stage 12 in the irradiation area, and the optical axis is in the vertical direction. According to the configuration, the focused ion beam can be irradiated on the irradiation target such as the sample S fixed to the stage 12, and the needle 18 existing in the irradiation area, vertically downward from the upper side.

The focused ion beam column 14 is provided with an ion source 14a which generates ions, and an ion optical system 14b which focuses and deflects ions extracted from the ion source 14a. The ion source 14a and the ion optical system 14b are controlled in accordance with the control signal output from the controller 21, and the position, condition, and the like of irradiation with the focused ion beam are controlled by the controller 21. For example, the ion source 14a is a liquid metal ion source using liquid potassium, a plasma ion source, a gas field ionization ion source, or the like. For example, the ion optical system 14b is provided with a first electrostatic lens such as a condenser lens, an electrostatic deflector, a second electrostatic lens such as an objective lens, and the like.

The electron beam column 15 is fixed to the sample chamber 11 in such a manner that, in the sample chamber 11, a beam emitting portion (not shown) faces the stage 12 in a tilt direction which is inclined by a predetermined angle with respect to the vertical direction of the stage 12 in the irradiation area, and the optical axis is parallel to the tilt direction. According to the configuration, the electron beam can be irradiated on the irradiation target such as the sample S fixed to the stage 12, and the needle 18 existing in the irradiation area, downward from the upper side in the tilt direction.

The electron beam column 15 is provided with an electron source 15a which generates electrons, and an electron optical system 15b which focuses and deflects electrons emitted from the electron source 15a. The electron source 15a and the electron optical system 15b are controlled in accordance with the control signal supplied from the controller 21, and the position, condition, and the like of irradiation with the electron beam are controlled by the controller 21. For example, the electron optical system 15b is provided with an electromagnetic lens, a deflector, and the like.

The placement positions of the electron beam column 15 and the focused ion beam column 14 may be replaced with each other so that the electron beam column 15 is placed in the vertical direction, and the focused ion beam column 14 is placed in a tilt direction which is inclined by a predetermined angle with respect to the vertical direction.

The detector 16 detects the intensity of the secondary charged particles (secondary electrons and secondary ions, or the like) R emitted from the irradiation target such as the sample S and the needle 18 by the irradiation with the focused ion beam or the electron beam (namely, the intensity means the quantity of the secondary charged particles) on the irradiation target, and outputs information of the detected intensity of the secondary charged particles R. The detector 16 is placed at a position which is in the sample chamber 11, and at which the intensity of the secondary charged particles R can be detected, such as that which is obliquely upward with respect to the irradiation target such as the sample S in the irradiation area. The detector is fixed to the sample chamber 11.

The gas supplying unit 17 is fixed to the sample chamber 11 in such a manner that, in the sample chamber 11, a gas outlet (not shown) faces the stage 12. The gas supplying unit 17 can supply to the sample S gasses such as an etching gas for selectively promoting etching of the sample S by the focused ion beam in accordance with the material of the sample S, and a deposition gas for forming a deposition film by a deposition material such as a metal or an insulator on the surface of the sample S. For example, an etching gas containing xenon fluoride for the sample S made of a Si material, water for the sample S made of an organic material, or the like is supplied together with irradiation by the focused ion beam to the sample S, whereby etching is selectively promoted. For example, a deposition gas of a compound gas containing phenanthrene, platinum, carbon, tungsten, or the like is supplied together with irradiation by the focused ion beam to the sample 5, whereby solid components decomposed from the deposition gas are caused to deposit on the surface of the sample S.

The needle actuator 19 is housed in the sample chamber 11 in a state where the mechanism is connected to the needle 18, and displaces the needle 18 in accordance with the control signal supplied from the controller 21. The needle actuator 19 is provided with a movement mechanism (not shown) which moves the needle 18 in parallel along the X-, Y-, and Z-axes, and a rotation mechanism (not shown) which rotates the needle 18 about the center axis of the needle 18.

The controller 21 is placed outside the sample chamber 11, and connected to the display device 20, and the user interface 22 which outputs a signal according to an operation input of the operator, such as a mouse and a keyboard.

The controller 21 generally controls the operation of the charged particle beam apparatus 10 by a signal which is output from the user interface 22, that which is produced by a preset automatic operation control process, and the like.

In accordance with the signal supplied from the user interface 22, the controller 21 controls the display device 20 to display various screens, and controls the needle actuator 19 to actuate and move the needle 18.

For example, the controller 21 converts the intensity of the secondary charged particles R which is detected by the detector 16, into a luminance signal corresponding to the irradiation position on the surface of the irradiation target (the sample S, the needle 18, and the like) in the irradiation area, thereby producing image data indicating the two-dimensional distribution of the intensity of the secondary charged particles R. Then, the controller 21 controls the display device 20 to display a screen for performing operations such as expansion, contraction, movement, and rotation of the image data, together with the produced image data. The controller 21 further controls the display device 20 to display a screen for performing operations such as contact of the needle 18 in the irradiation area with a desired place, movement to a designated position, setting of the movement speed, and retraction to the outside of the scan area, together with the produced image data.

In this embodiment, the controller 21 serves as an image processor configured to produce image data indicating a two-dimensional distribution of intensity of the secondary charged particles detected by the detector 16.

In the screen for moving the needle 18 by the user interface 22, for example, the controller 21 causes the cursor of the user interface 22 to be displayed on the produced image data. The cursor is operated by the operator through an input operation made to the user interface 22, so that the movement position, route, and the like of the needle 18 on the image data are instructed. In accordance with the instructions, the needle actuator 19 is actually operated to actuate and move the needle 18.

The charged particle beam apparatus 10 according to the embodiment is configured as described above. Next, the operation of the charged particle beam apparatus 10 will be described.

Figure 2:
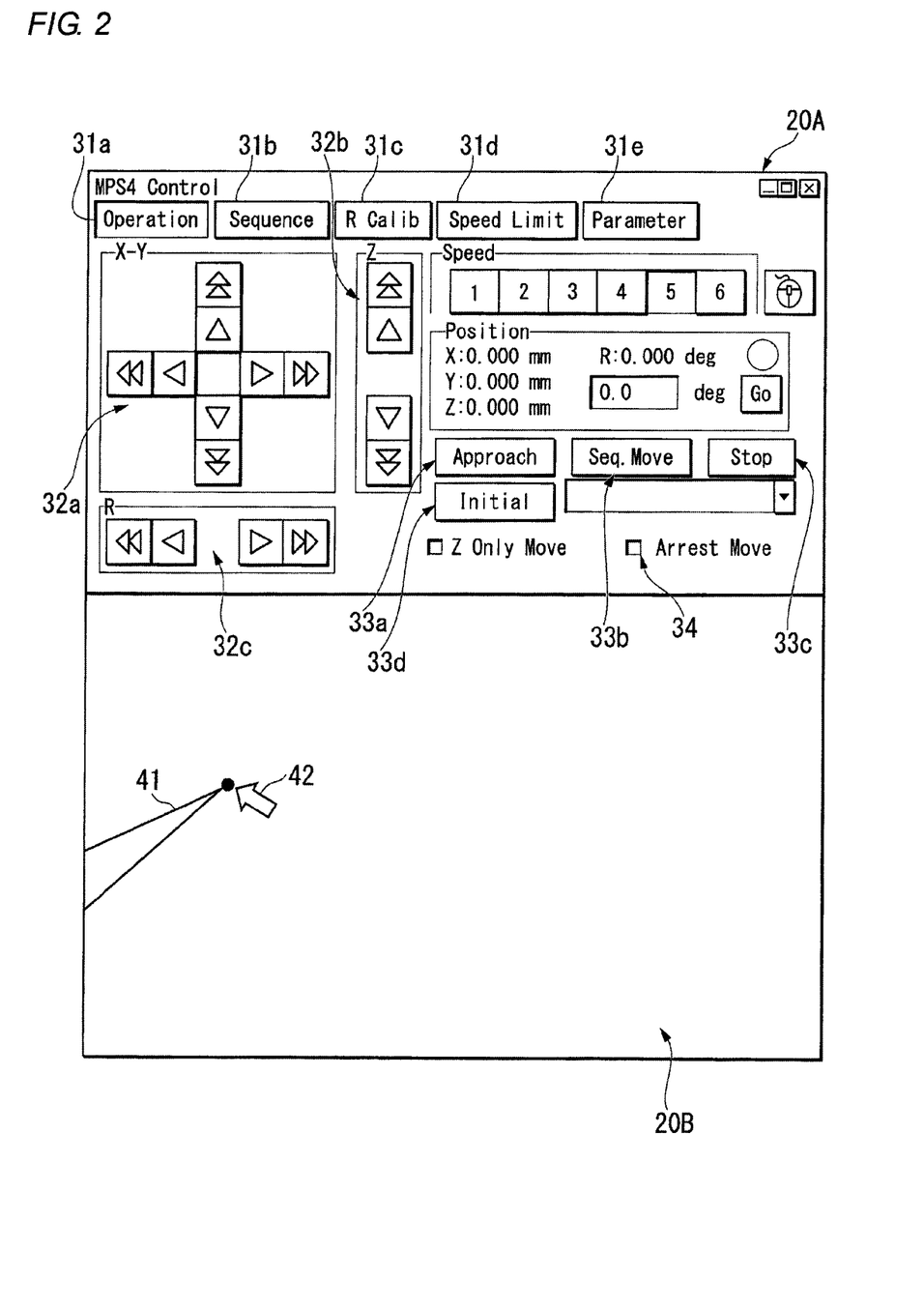
FIG. 2 is a view showing an example of an operation screen and a display screen of the charged particle beam apparatus according to the embodiment.

The controller 21 controls the display device 20 to display an operation screen 20A and an display screen 20B, as shown in FIG. 2, as screens for actuating the needle 18 by the user interface 22. A plurality of or first to fifth operation menus 31a to 31e the selection of which can be switched by an operation of the user interface 22 are disposed in the operation screen 20A.

When the first operation menu 31a is selected, the controller 21 causes the operation screen 20A of "Operation", and the display screen 20B having the latest image data and the cursor of the user interface 22 to be displayed on the display device 20. The operation screen 20A of "Operation" is provided with menus 32a to 32c for instructing jog drives (namely, drives which are continued without designating the actuating amount) of the needle 18 to be performed in the corresponding one of the X-, Y-, and Z-axis directions, and the direction of rotation about the center axis. The operation screen 20A of "Operation" is provided with menus 33a to 33d for giving various instructions to the automatic movement of the needle 18. The menu 33a of "Approach" instructs the needle 18 to automatically moving to the irradiation area. The menu 33b of "Sequence" instructs the needle 18 to automatically continuously move along a preset movement route. The menu 33c of "Stop" instructs the needle 18 to stop the automatic movement. The menu 33d of "Initial" instructs the needle 18 to automatically retract to a reference position which is outside the irradiation area. The operation screen 20A of "Operation" further is provided with menus (not shown) for changing the movement speed of the needle 18.

The operation screen 20A of "Operation" is provided with a track menu 34 for instructing execution of automatic continuous movement of the needle 18 so as to track the movement of the cursor in the display screen 20B according to the operation of the user interface 22.

The display screen 20B has a cursor 42 for the user interface 22 which is used for causing an image of the irradiation target (for example, a needle image of the needle 18) 41 to perform track movement, on the latest image data in which the needle image 41 is displayed.

In the case where the track menu 34 is selected in the operation screen 20A of "Operation", the controller 21 repeatedly acquires the position of the cursor 42 which is moved in the display screen 20B in accordance with a predetermined operation on the user interface 22, at predetermined timings, for example, with a preset intervals. Then, the actual needle 18 is driven by the needle actuator 19 so that the needle image 41 on the image data sequentially tracks the positions of the cursor 42 which are acquired.

During scanning irradiation with the charged particle beam (the focused ion beam and the electron beam), i.e., during production of image data, the controller 21 enables the needle actuator 19 to actuate the needle 18. In the case where the stage 12 is maintained to have a predetermined posture state by the stage actuator 13, moreover, the controller 21 enables the needle actuator 19 to actuate the needle 18. For example, the predetermined posture state is a state where the surface of the stage 12 is substantially perpendicular to the irradiation direction of the charged particle beam (the focused ion beam and the electron beam).

Figure 3:
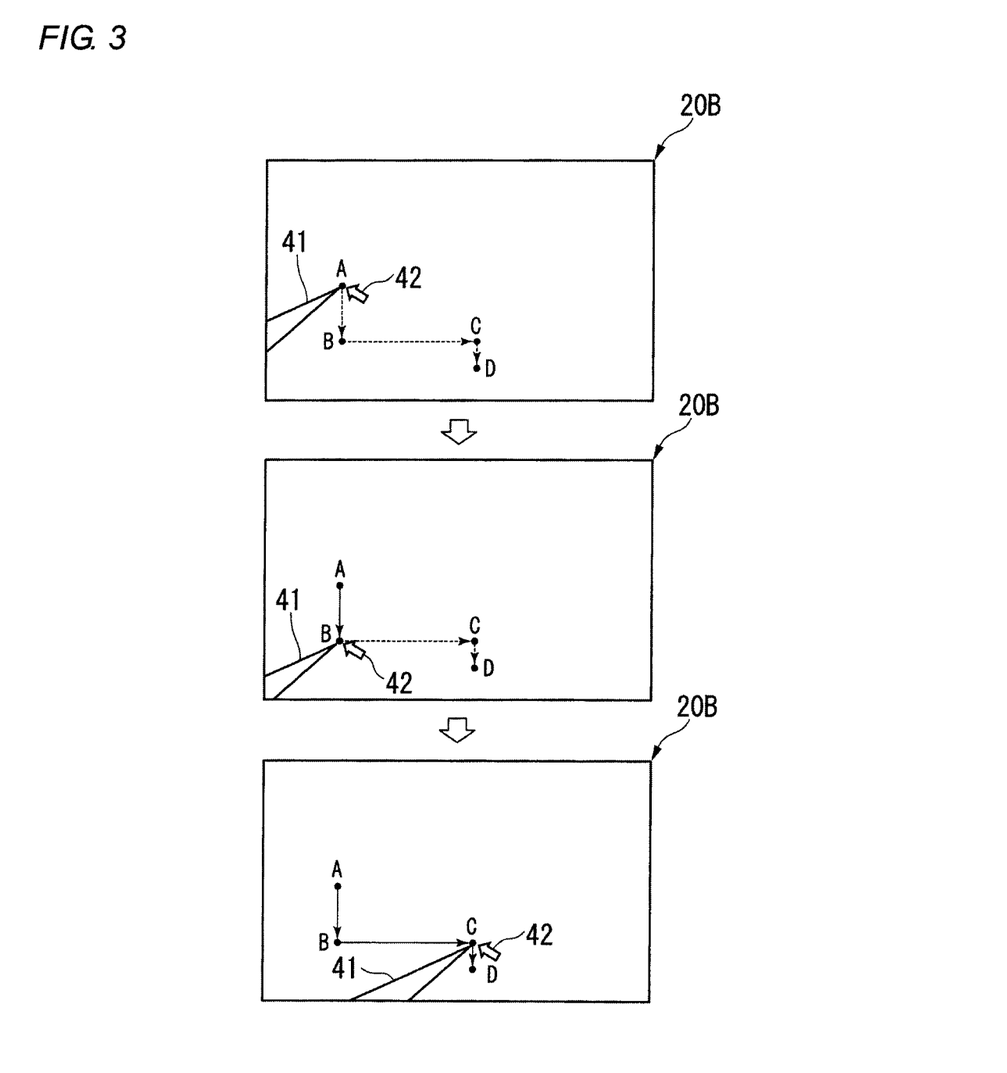
FIG. 3 is a view showing an example of a change of the position of a needle image which tracks the movement of a cursor on images data in the display screen of the charged particle beam apparatus according to the embodiment.

When, as sequentially shown in the upper, middle, and lower figures of FIG. 3, the controller 21 sequentially acquires a first position A, a second position B, and a third position C as the position of the cursor 42 in the display screen 20B, for example, the target position of the needle image 41 is sequentially updated in accordance with the position of the cursor 42.

First, the first position A is acquired as the position of the cursor 42, and then the controller 21 stores the positional coordinates of the first position A as the reference position.

Next, the second position B is acquired as the position of the cursor 42, and then the controller 21 calculates the relative distance between the positional coordinates of the second position B and the reference position. The positional coordinates which are obtained by adding the calculated relative distance to the reference position are set as a target position of the needle image 41 on the image data. Then, the needle 18 is driven by the needle actuator 19 so that the needle image 41 on the image data is moved to the target position at this timing. As a result, the needle image 41 on the image data is moved from the current position (i.e., the first position A) to the target position at this timing (i.e., the second position B).

Next, the third position C is acquired as the position of the cursor 42, and then the controller 21 calculates the relative distance between the positional coordinates of the third position C and the reference position. The positional coordinates which are obtained by adding the calculated relative distance to the reference position are newly set as the target position of the needle image 41 on the image data. Then, the needle 18 is driven by the needle actuator 19 so that the needle image 41 on the image data is moved to the target position at this timing. As a result, the needle image 41 on the image data is moved from the current position (i.e., the second position B) to the target position at this timing (i.e., the third position C).

When the needle 18 is to be actuated by the needle actuator 19 with using the relative distance with respect to the reference position which is obtained from the position of the cursor 42 in the display screen 20B, the controller 21 performs the control based on relative relationships between the irradiation directions of the focused ion beam and the electron beam, and the actuating axes (i.e., the X-, Y-, and Z-axes) which are set with respect to the needle actuator 19.

Even in the case where the movement of the cursor 42 in the display screen 20B is faster than that of the actual needle 18, the controller 21 performs the above-described process to move the needle image 41 on the image data while tracking the cursor 42.

Figure 4:
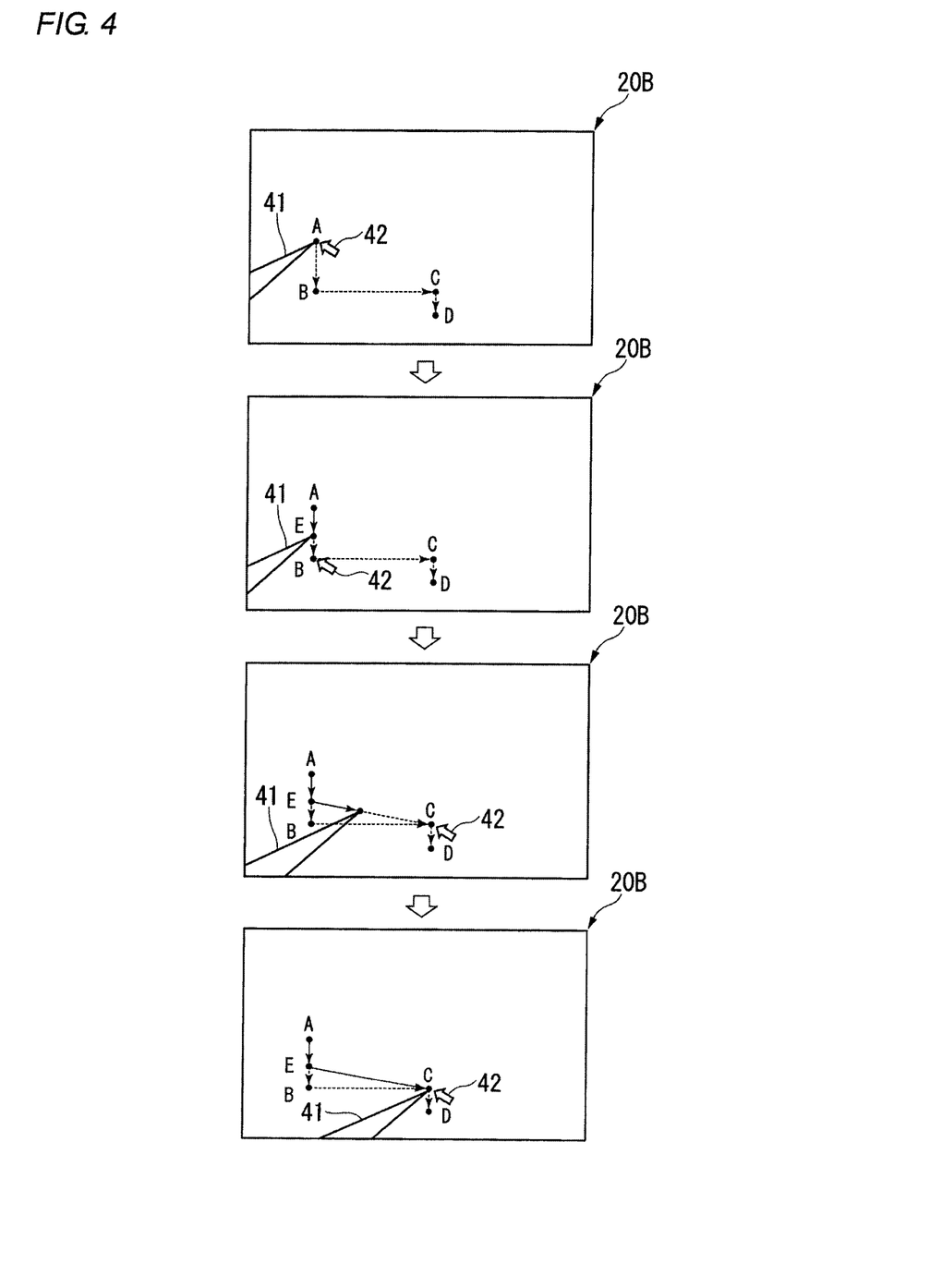
FIG. 4 is a view showing another example of a change of the position of the needle image which tracks the movement of the cursor on images data in the display screen of the charged particle beam apparatus according to the embodiment.

When, as sequentially shown in the upper, upper middle, lower middle, and lower figures of FIG. 4, the controller 21 sequentially acquires the first position A, the second position B, and the third position C as the position of the cursor 42 in the display screen 20B, for example, the target position of the needle image 41 is sequentially updated in accordance with the position of the cursor 42.

First, the first position A is acquired as the position of the cursor 42, and then the controller 21 stores the positional coordinates of the first position A as the reference position.

Next, the second position B is acquired as the position of the cursor 42, and then the controller 21 calculates the relative distance between the positional coordinates of the second position B and the reference position. The positional coordinates which are obtained by adding the calculated relative distance to the reference position are set as a target position of the needle image 41 on the image data. Then, the needle 18 is driven by the needle actuator 19 so that the needle image 41 on the image data is moved to the target position at this timing. As a result, the needle image 41 on the image data is moved from the current position (i.e., the first position A) to the target position at this timing (i.e., the second position B).

Next, the third position C is acquired as the position of the cursor 42 at a timing before the needle 18 reaches the target position at this timing, and then the controller 21 calculates the relative distance between the positional coordinates of the third position C and the reference position. The positional coordinates which are obtained by adding the calculated relative distance to the reference position are newly set as the target position of the needle image 41 on the image data. Then, the needle 18 is driven by the needle actuator 19 so that the needle image 41 on the image data is moved to the target position at this timing. As a result, the needle image 41 on the image data is moved from the current position (i.e., a position E between the first position A and the second position B) to the target position at this timing (i.e., the third position C).

Namely, the controller 21 updates the movement instructions for the needle actuator 19 at the timing when the new position of the cursor 42 is acquired, and therefore the needle 18 in the real space is driven so that the movement locus of the cursor 42 in the display screen 20B draws a smooth curve while being subjected to so-called smoothing.

Figure 5:
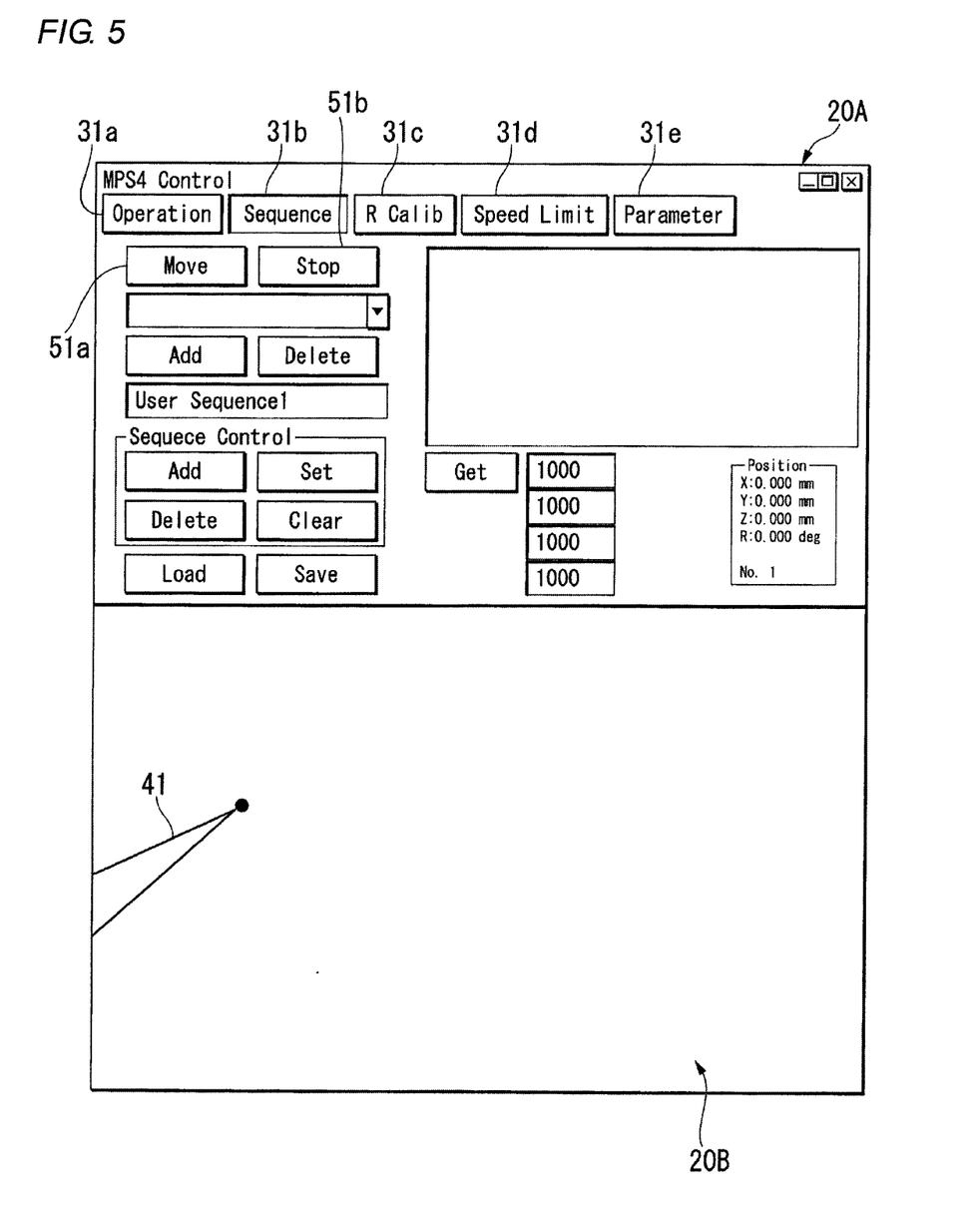
FIG. 5 is a view showing another example of the operation screen and display screen of the charged particle beam apparatus according to the embodiment.

When the second operation menu 31b is selected in the operation screen 20A, the controller 21 causes the operation screen 20A of "Sequence", and the display screen 20B having the latest image data to be displayed on the display device 20 as shown in FIG. 5. The operation screen 20A of "Sequence" is provided with menus 51a, 51b for instructing the sequential movement (namely, the automatic and continuous movement along the preset movement route) of the needle 18 to start and stop, and menus for instructing addition and deletion of a movement route, and the like.

In a case where the menu 51a for instructing the sequential movement to start is selected in the operation screen 20A of "Sequence", the controller 21 causes the needle actuator 19 to actuate the needle 18 based on the current position of the needle 18 and the preset movement route. For example, the controller 21 extracts the positional coordinates which are closest to the current position of the needle 18, from the plurality of positional coordinates constituting the preset movement route, and the needle 18 is automatically moved from the extracted positional coordinates on the movement route.

Figure 6:
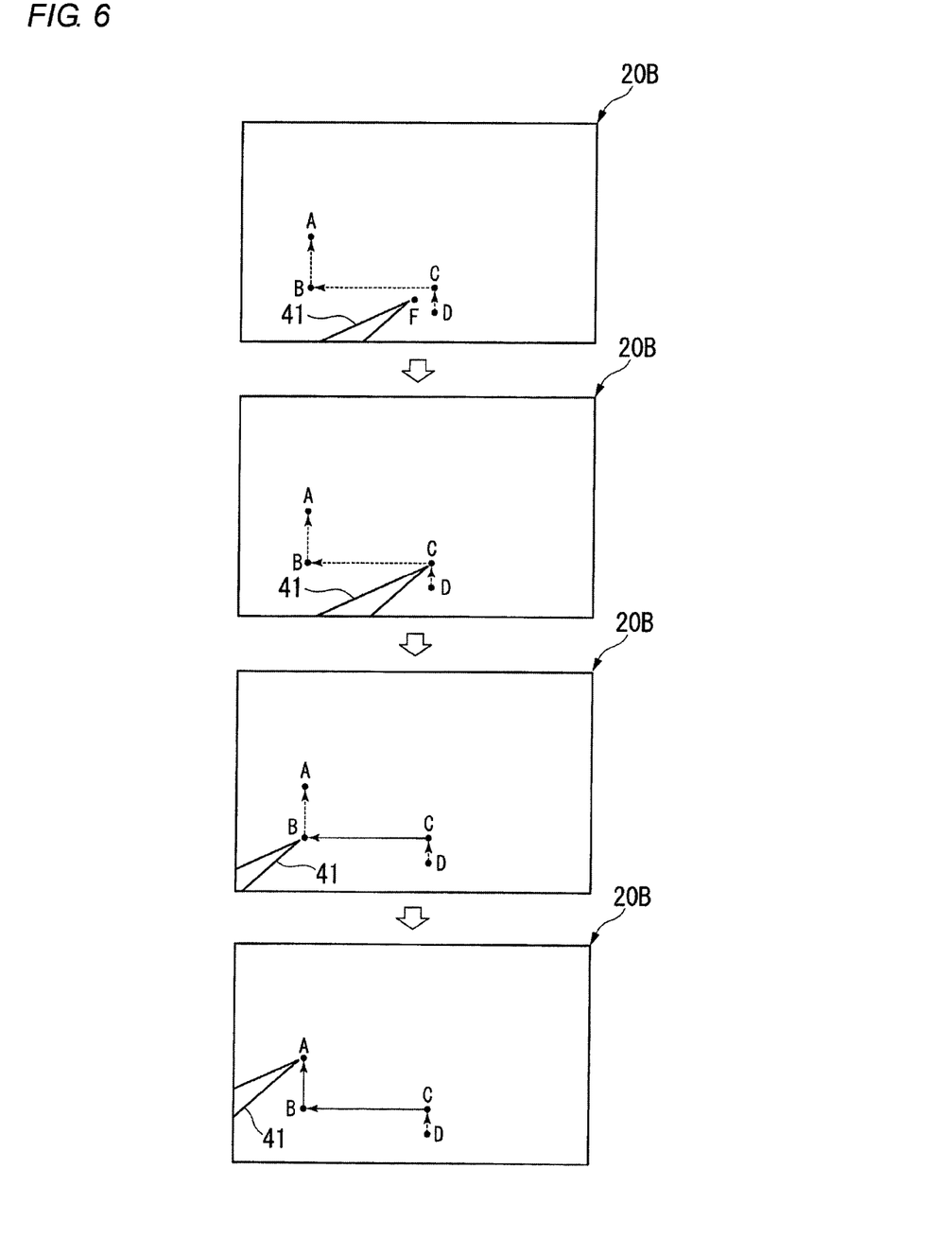
FIG. 6 is a view showing an example of needle movement in sequential movement in the charged particle beam apparatus according to the embodiment.

When, as sequentially shown in the upper, upper middle, lower middle, and lower figures of FIG. 6, the movement route is set by the first position A, second position B, third position C, and fourth position D corresponding to a plurality of positional coordinates in the real space, for example, the controller 21 first extracts the third position C which is closest to the current position F of the needle 18.

Next, the controller 21 causes the needle actuator 19 to actuate the needle 18 so that the needle 18 is moved from the current position F at this timing to the third position C which is closest to the current position F.

Then, the controller 21 causes the needle actuator 19 to actuate the needle 18 so that the needle 18 is moved in the movement direction (for example, in the direction along which the needle is sequentially moved to the fourth position D, the third position C, the second position B, and the first position A) which is set on the movement route.

The display screen 20B of FIG. 6 may be an image obtained by an optical microscope in place of an image data due to a charged particle beam. In this case, the charged particle beam apparatus 10 may include an optical microscope which can observe the interior of the charged particle beam apparatus 10.

In a case where an adequate movement route of the needle 18 is previously set in the operation screen 20A of "Sequence", the controller 21 previously selects the actuating axis (or the actuating direction) of the needle actuator 19 with respect to the actuating of the needle 18, for each of the plurality of positional coordinates defining the movement route.

Alternatively, in the setting of the movement route, a registration method in which the needle 18 is moved and the position after the movement is designated may be used in place of the registration method in which the coordinates of a plurality of positions are designated. Namely, the needle 18 is moved, and, while visually checking that the needle 18 does not interfere with the components of the charged particle beam apparatus 10, for example, the focused ion beam column 14, the positions after the movement are registered one by one. According to the method, the needle 18 can be moved more safely.

When the third operation menu 31c is selected in the operation screen 20A, the controller 21 causes an operation screen (not shown) of "Correction of eccentricity" to be displayed on the display device 20. The operation screen of "Correction of eccentricity" is provided with a plurality of menus (not shown) for correcting a positional displacement of the needle 18 which is obtained from the rotation locus of the needle 18 about the center axis.

The controller 21 elliptically approximates the eccentricity locus of the needle 18 by using the positions of the needle 18 for at least three angles which are obtained when the needle 18 is rotated about the enter axis by the rotation mechanism (not shown) of the needle actuator 19. For example, the controller 21 calculates a change of the position of the needle 18 at three or more different angles, by using a sinusoidal wave, whereby the eccentricity locus of the needle 18 is approximated to an ellipse or a circle. Then, the controller 21 corrects the positional displacement of the needle 18 by using the eccentricity locus of the needle 18, at each of the respective predetermined angles.

When the fourth operation menu 31d is selected in the operation screen 20A, the controller 21 causes an operation screen (not shown) of "Speed limit" to be displayed on the display device 20. The operation screen of "Speed limit" is provided with a plurality of menus (not shown) for automatically changing the actuating speed of the needle 18 in accordance with the position, actuating amount, and the like of the needle 18.

For example, the controller 21 performs settings so that, during the sequential movement of the needle 18, the actuating speed changes on a downward trend in accordance with the approach of the needle 18 toward the end position of the movement route.

The controller 21 may cause the needle 18 to be moved by using a contact sensor function of the needle 18. For example, a change of the electric resistance when the needle 18 makes contact with a component of the charged particle beam apparatus 10 or the sample S is detected, and the contact is sensed. When a contact is sensed, the controller 21 stops the movement of the needle 18. This configuration enables the needle 18 to be safely moved.

When the fifth operation menu 31e is selected in the operation screen 20A, the controller 21 causes an operation screen (not shown) of "Parameter" to be displayed on the display device 20. The operation screen of "Parameter" is provided with a plurality of menus (not shown) for setting various parameters for the actuating of the needle 18 by the needle actuator 19.

As described above, the charged particle beam apparatus 10 according to the embodiment is provided with the controller 21 which controls the movement of the needle 18 along the preset movement route, and therefore the safety in the case where the needle 18 is automatically moved in the charged particle beam apparatus 10 can be improved. Moreover, the apparatus is provided with the controller 21 which selects the actuating axis (or the actuating direction) of the needle actuator 19 with respect to the actuating of the needle 18, for each of the plurality of positional coordinates defining the movement route. Therefore, the control process of the needle actuator 19 for moving the needle 18 can be simplified.

Furthermore, the positional coordinates which are closest to the current position of the needle 18 are extracted from the plurality of positional coordinates defining the movement route, and the needle 18 is automatically moved from the positional coordinates in the movement route. Therefore, the safety in the case where the needle 18 is automatically moved can be further improved.

Hereinafter, a first modification of the above-described embodiment will be described.

In a case where, in the above-described embodiment, the needle image 41 on the image data is to track the movement of the cursor 42 in the display screen 20B, the controller 21 may select the actuating axis (or the actuating direction) of the needle actuator 19 in accordance with the irradiation direction of the charged particle beam (i.e., the focused ion beam and the electron beam).

Hereinafter, a case where the angle between the irradiation directions of the focused ion beam and the electron beam is a predetermined angle (for example, an adequate angle between 50 degrees and 90 degrees, such as 55 degrees), and the irradiation direction of the focused ion beam is parallel to the Z-axis of the needle actuator 19 will be exemplarily described.

In this case, the image data obtained by the focused ion beam form an image on the X-Y plane configured by the X- and Y-axes of the needle actuator 19. The image data obtained by the electron beam form an image (for example, an image on the X-Z plane) which is inclined by a predetermined angle with respect to the Z-axis of the needle actuator 19.

First, the controller 21 sets the target position of the needle 18 in accordance with the position of the cursor 42 in the display screen 20B by using the image data of the focused ion beam, and drives the needle 18 by using only the X- and Y-axes of the needle actuator 19. As a result, the needle 18 is moved to an adequate position in the Z-axis direction including the actual target position.

By using the image data of the electron beams, then, the controller 21 sets the target position of the needle 18 in accordance with the position of the cursor 42 in the display screen 20B, and drives by using only the Z-axis of the needle actuator 19. As a result, the needle 18 is moved from the adequate position in the Z-axis direction including the actual target position, to an actual target position.

In the case where the needle 18 is to be actuated by using the image data of the electron beams, the controller 21 may drive the needle 18 by using also the X-axis in addition of the Z-axis of the needle actuator 19 as required.

According to the first modification, the actuating axis (or the actuating direction) of the needle actuator 19 is selected in accordance with the irradiation direction of the charged particle beam (i.e., the focused ion beam and the electron beam), and therefore the actuating of the needle 19 in three-dimensional directions can be easily controlled.

Hereinafter, a second modification of the above-described embodiment will be described.

In the case where, in the above-described embodiment, the needle image 41 on the image data is to track the movement of the cursor 42 in the display screen 20B, the controller 21 may select the actuating axis (or the actuating direction) of the needle actuator 19 in accordance with the scanning direction of the charged particle beam (i.e., the focused ion beam and the electron beam).

Hereinafter, a case where the scanning direction of the focused ion beam is caused to be rotated by a predetermined angle θ with respect to the X-axis of the needle actuator 19 by, for example, the relative position between the sample S and the needle 18 will be exemplarily described.

In this case, by using a relative distance (X, Y) with respect to the reference position which is obtained from the position of the cursor 42 in the display screen 20B by the image data of the focused ion beam, the controller 21 provides the X- and Y-axes of the needle actuator 19 with movement instructions (X cos θ−Y sin θ, X sin θ+Y cos θ).

According to the second modification, the actuating axis (or the actuating direction) of the needle actuator 19 is selected in accordance with the scanning direction of the charged particle beam (i.e., the focused ion beam and the electron beam), and therefore the actuating of the needle 19 in three-dimensional directions can be easily controlled.

Hereinafter, a third modification of the above-described embodiment will be described.

In the case where, in the above-described embodiment, the needle 18 is to be sequentially actuated, when the current position of the needle 18 exists in a predetermined positional area, the controller 21 may set a relative route which is based on the current position of the needle 18, with respect to the preset movement route. For example, the predetermined positional area is an area where the relative route does not interfere with the components of the charged particle beam apparatus 10.

Figure 7:
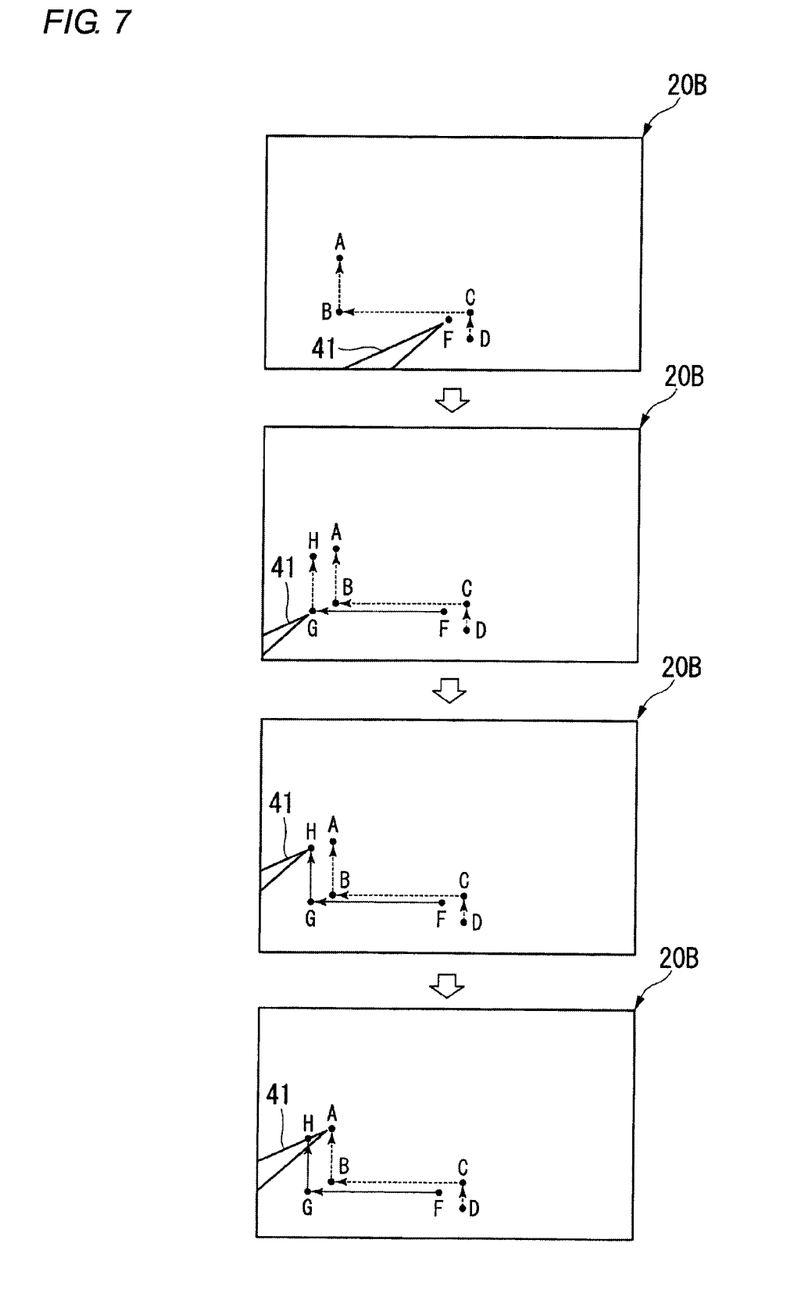
FIG. 7 is a view showing an example of needle movement in sequential movement in a charged particle beam apparatus of a third modification according to the embodiment.

When, as sequentially shown in the upper, upper middle, lower middle, and lower figures of FIG. 7, the movement route is set by the first position A, second position B, third position C, and fourth position D corresponding to a plurality of positional coordinates in the real space, the controller 21 first sets the relative route. For example, the controller 21 extracts the third position C which is closest to the current position F of the needle 18, from the plurality of positional coordinates constituting the preset movement route. With respect to the route which is in the preset movement route, and which is subsequent to the third position C, the controller 21 sets the relative route which is based on the current position F of the needle 18.

Then, the controller 21 causes the needle actuator 19 to actuate the needle 18 so that the needle 18 is moved in the movement direction (for example, in the direction along which the needle is sequentially moved to the current position F, a fifth position G, and a sixth position H) which is set on the relative route.

In the case where the needle 18 reaches the end point (i.e., the sixth position H) of the relative route, the controller 21 may cause the needle actuator 19 to actuate the needle 18 in such a manner that the needle 18 is moved to the end point (i.e., the first position A) of the preset movement route.

According to the third modification, the control process in the case where the needle 18 is to be sequentially actuated can be simplified.

In the above-described embodiment, the controller 21 may be a software functional section, or a hardware functional section such as an LSI.

The technical scope of the invention is not limited to the above-described embodiment, and is provided with configuration in which various changes are made on the above-described embodiment without departing the spirit of the invention. Namely, the configuration of the above-described embodiment is a mere example, and can be adequately changed.

What is claimed is:

1. A charged particle beam apparatus comprising:
   a charged particle beam column configured to irradiate an irradiation target with a charged particle beam;
   a detector configured to detect secondary charged particles emitted from the irradiation target by the irradiation of the charged particle beam;
   a needle arranged in an irradiation area of the charged particle beam;
   a needle actuator configured to actuate the needle; and
   a controller configured to control the needle actuator to actuate the needle along a movement route that is configured by a preset target position and preset way points,
   wherein the controller controls the needle actuator to set an actuating direction of the needle for each of the way points.

2. The charged particle beam apparatus according to claim 1,
   wherein the controller is configured to control the needle actuator to start actuating the needle along the movement route from one of the way points that is closest to a current position of the needle.

3. The charged particle beam apparatus according to claim 1,
   wherein the controller is configured to control the needle actuator to actuate the needle along a relative route that is relative to the movement route based on a current position of the needle in a case where the current position is within a predetermined positional area.

4. The charged particle beam apparatus according to claim 1,
   wherein the controller is configured to control the needle actuator to set a movement speed of the needle in accordance with a position of the needle.

* * * * *